United States Patent [19]
Cox et al.

[11] Patent Number: 5,706,204
[45] Date of Patent: Jan. 6, 1998

[54] APPARATUS FOR TRIGGERING ALARMS AND WAVEFORM CAPTURE IN AN ELECTRIC POWER SYSTEM

[75] Inventors: Roger W. Cox, Oakdale; Robert T. Elms, Monroeville; Sally A. Putt, Imperial, all of Pa.

[73] Assignee: Eaton Corporation, Cleveland, Ohio

[21] Appl. No.: 608,387

[22] Filed: Feb. 28, 1996

[51] Int. Cl.[6] ................................................. G01R 13/02
[52] U.S. Cl. ........................... 364/487; 364/481; 364/483; 364/550; 324/76.11; 324/76.15
[58] Field of Search .................................. 364/480–487, 364/492, 550, 551.01, 178, 464.04; 324/142, 500, 509, 511, 620, 626, 623, 76.11, 76.12, 76.15, 76.24, 76.38, 76.42; 340/660, 664, 661, 662, 657, 870.02, 670.05, 500, 658, 509, 511, 521; 307/105; 361/85, 93, 87, 86, 78, 65, 42, 57, 63, 79, 90–92

[56] References Cited

U.S. PATENT DOCUMENTS

| | | | |
|---|---|---|---|
| 4,589,074 | 5/1986 | Thomas et al. | 364/483 |
| 4,672,555 | 6/1987 | Hart et al. | 364/483 |
| 4,983,955 | 1/1991 | Han, Jr. et al. | 340/662 |
| 5,182,547 | 1/1993 | Griffith | 340/664 |
| 5,224,054 | 6/1993 | Wallis | 364/483 |
| 5,233,538 | 8/1993 | Wallis | 364/483 |
| 5,414,635 | 5/1995 | Ohta | 364/487 |
| 5,487,016 | 1/1996 | Elms | 364/484 |
| 5,490,086 | 2/1996 | Leone et al. | 364/492 |
| 5,587,917 | 12/1996 | Elms | 364/487 |

*Primary Examiner*—Emanuel T. Voeltz
*Assistant Examiner*—Hal D. Wachsman
*Attorney, Agent, or Firm*—Martin J. Moran

[57] ABSTRACT

A monitor/analyzer for an ac electrical system can be programmed through a display on the front panel to respond to selected events by generating triggers signals when selected monitored electrical parameters including neutral current exceed programmed thresholds. The trigger signals initiate simultaneous waveform capture of multiple waveforms in the ac system. Multiple trigger signals result in sequential waveform capture so that if a plurality of triggers are programmed for the same event, extended waveform data is captured for the event. Alarm screens are generated in response to the events, as well as for hardware failure, an excessive neutral-to-ground voltage or reverse sequence.

13 Claims, 10 Drawing Sheets

APPARATUS FOR TRIGGERING ALARMS AND WAVEFORM CAPTURE IN AN ELECTRIC POWER SYSTEM

BACKGROUND OF THE INVENTION

1. Field of the Invention

This invention relates to apparatus for monitoring electric power systems, and more particularly, to such apparatus that digitally captures portions of the waveforms of the electric power system in response to selected trigger conditions, which include neutral current conditions.

2. Background Information

State of the art monitors for ac power systems incorporate microcomputers for calculating various electrical parameters such as rms currents and voltages, peak currents and voltages, power, energy, power factor and the like. One such monitor is disclosed in commonly owned U.S. patent application Ser. No. 08/325,711 filed on Oct. 17, 1994, now U.S. Pat. No. 5,587,917. In addition to monitoring the various electrical parameters of the ac system, this monitor also digitally captures portions of the waveform for harmonic analysis. This places a very high burden on the microcomputer in the monitor. Accordingly, this monitor uses a slow sampling rate for gathering the data needed for performing the monitoring functions and operates at a second, higher rate for waveform capture in response to a manual command or automatically in response to values of selected ones of the electrical parameters which exceed predetermined thresholds.

Generally, monitoring systems have not monitored neutral current. It has been known to monitor neutral to ground voltage but not the current. However, it has been found that imbalances between the phase currents produced by many loads now commonly used such as computers, can produce considerable neutral current.

There is a need therefore for an improved monitor for ac electrical systems that provide an improved capability for managing waveform capture.

In connection with this, there is a need for such a monitor in which the events which trigger waveform capture may be more easily selected and changed.

There is also a need for such a monitor that provides data on the neutral current.

There is an additional need for such an improved monitor that alerts the user to abnormal conditions in a clear and understandable fashion.

SUMMARY OF THE INVENTION

These needs and others are satisfied by the invention, which is directed to apparatus for monitoring an ac electrical power system that includes means for sensing the multiple waveforms in the ac system and means for generating digital samples of each of these multiple waveforms. The apparatus further includes digital processing means for generating from the digital samples values of a plurality of electrical parameters. The digital processing means also includes programmable means, which is programmable through a display device for generating programmable trigger signals when the values of programmed ones of the electrical parameters exceed predetermined thresholds. Capture means then captures the digital samples for selected portions of at least some of the waveforms in response to the programmed trigger signals. Preferably, the capture means captures selected portions of all of the waveforms simultaneously in response to a programmed trigger signal. As the programmable trigger means is capable of generating a plurality of trigger signals, the same trigger value can be programmed into multiple triggers so that when this threshold value is exceeded, multiple repetitions of the selected portion of the waveform will be captured.

The apparatus also includes means for generating alarms in response to predetermined values of predetermined ones of the electrical parameters. The alarms are presented on an alarm screen to clearly identify to the user the alarm condition. In particular, neutral current that exceeds a predetermined threshold will generate an alarm. An alarm will also be generated when the harmonic distortion in the neutral current exceeds a predetermined value.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

Figure 1:
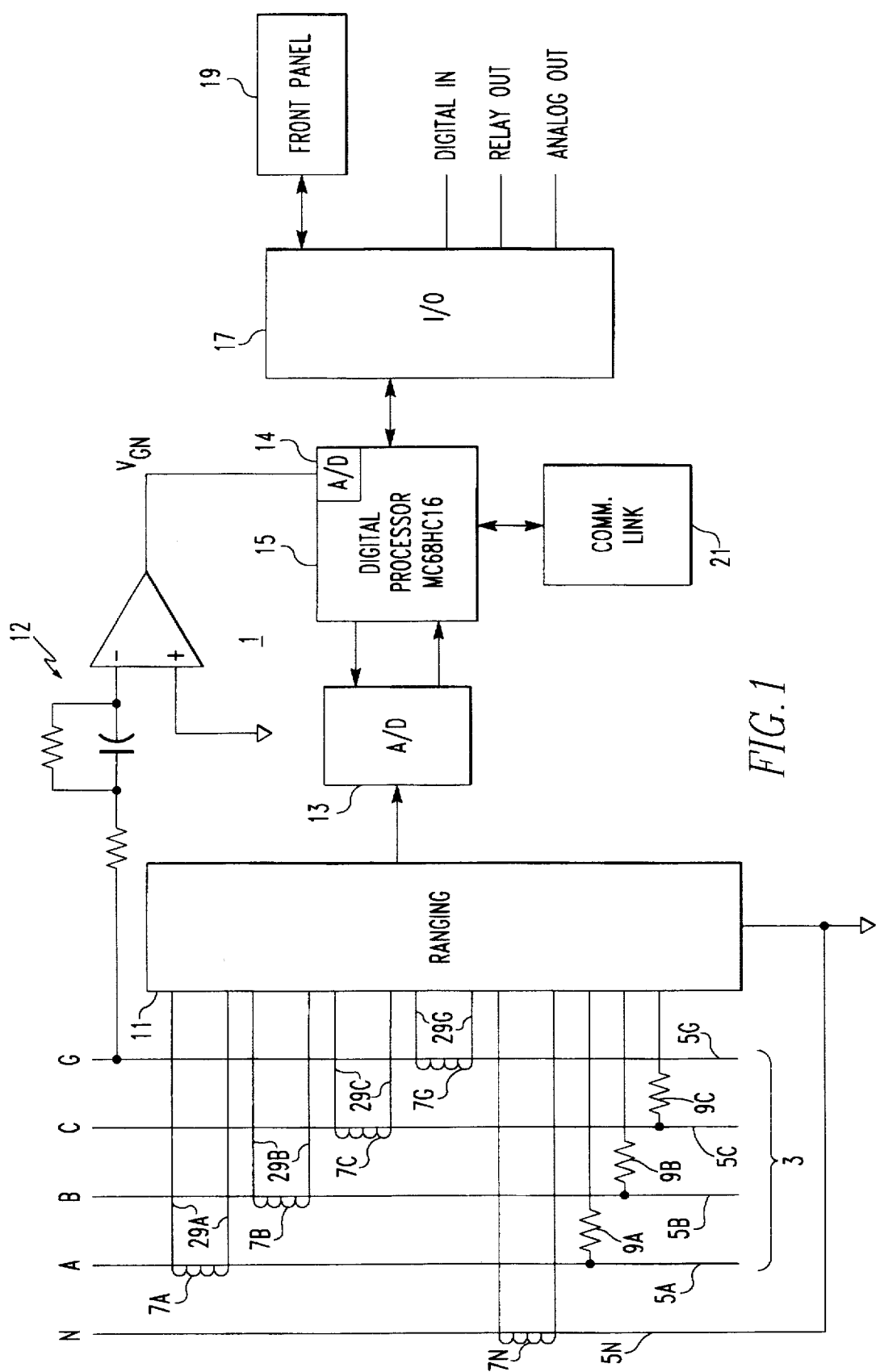
FIG. 1 is a schematic diagram primarily in block form of a monitor in accordance with the invention.

Referring to FIG. 1, the analyzer/monitor 1 of the invention is used to monitor and analyze an electric power system 3 such as a power distribution system. The power distribution system 3 illustrated has three phase conductors 7A, B and C, a neutral conductor 5N, and a ground conductor 5G. Current transformers 5A, B, C, G and N sense current flowing in each of these conductors while phase-to-neutral voltages are sensed by the sensing resistors 9A, B, and C. A ranging circuit 11 converts the currents and phase voltages from −10 to 0 to +10 volt signals for conversion by analog-to-digital (A/D) converter 13 for input to a digital processor 15. The A/D converter 13 samples the analog voltages and currents at intervals determined by interrupts generated by a digital processor 15. These interrupts are generated selectively at a first, slow speed sampling rate, or a second, high speed sampling rate. During low speed sampling, the A/D converter 13 samples all 5 currents and all 3 voltages. For high speed sampling, again all currents and the three-phase voltages are digitized for input to the processor. Each of these currents and voltages is sampled on each interrupt. The ground to neutral voltage $V_{GN}$ is amplified by an input circuit 12 and converted to digital samples by an analog-to-digital (A/D) converter 14 in the digital processor 15.

The digital processor 15 utilizes the digital samples to generate values of two sets of electrical parameters. The first set of parameters is related to the monitoring function and includes metered parameters such as: rms currents and voltages, peak currents and voltages, minimum currents and voltages, power factor, watts, Vars, volt-amps, total harmonic distortion K-factor, CBEMA derating factor, and the like. The second set of parameters calculated by the digital processor 15 comprises the individual harmonic coefficients. Data collection and processing are organized in the manner described in U.S. Pat. No. 5,587,917, so that a maximum number of parameters can be monitored continuously while also providing the capability for simultaneous calculation of harmonic content.

The digital processor 15 has an input/output (I/O) 17 through which the processor 15 is connected to a front panel 19. The front panel 19 serves as an interface with the user. It is through the front panel that the user can control the operation of the analyzer/monitor 1 and monitor the ac electrical power system 3. The input/output device 17 also interfaces the digital processor 15 with contact inputs through digital inputs. Relay outputs and analog outputs are also provided through the input/output device 17. The digital processor 15 can also communicate with a remote processor through a communications link 21. Through this communications link 21, the analyzer/monitor 1 can provide information to and/or be controlled by a remote processor (not shown).

The digital processor 15 generates the interrupts at a slow rate for monitoring, and at a faster rate for data capture in order to control the burden on the processor so that all of the required functions can be performed. The sampling scheme used by the digital processor 15 is the same as that described in U.S. Pat. No. 5,587,917 referenced above. As is known, waveform capture requires synchronous sampling at a rate that is at least twice that of the highest harmonic to be extracted. The monitoring functions, on the other hand, do not require synchronous sampling. Hence, the technique known as equivalent sampling is used for the slow speed sampling in order to increase the effective sampling rate. In the equivalent sampling technique, the ac waveforms are sampled a selected number of times per cycle with a delay of a fraction of a cycle before another cycle of samples is taken at the same sampling rate. Thus, the sampling instants are "bumped" each cycle by the selected fraction of a cycle. The data collected over a number of such "bumped" cycles are then used to calculate the various parameters.

Equivalent sampling at low speed with selectable high speed sampling for waveform capture is implemented by sampling in frames. Each sampling frame comprises a number of repetitions of sampling for a selected number of cycles followed by a delay which is a fraction of a cycle. In the exemplary system, the selected number of cycles is two and the frame constitutes four repetitions of sampling of two cycles each followed by a delay $\delta$. Thus, the exemplary frame is equal to eight cycles plus 4 $\delta$. The slow speed sampling rate is 32 samples per cycle and $\delta$ is made equal to $\frac{1}{128}$ of a cycle so that the sampling frame is equal to $8\frac{1}{32}$ cycles of the fundamental frequency of the waveforms. This provides an equivalent sampling rate of 128 samples per cycle.

High speed sampling can be implemented in any one of the repetitions, but only one, during a sampling frame. Thus, for instance in the exemplary system, high speed sampling, when called for, is implemented in the third repetition within the frame. Any one of the frames can be used for high speed sampling, but it is always the same repetition within the frame. Since high speed sampling is performed for only one repetition, the sampling can be synchronous, a requirement for Fourier analysis of the harmonic content of the waveform. By synchronous, it is meant that an integer number of samples are taken per cycle. As the delay, $\delta$, comes at the end of the repetition, it does not disturb the synchronous sampling performed during only one repetition. The high speed sampling is carried out at a rate that is an integer multiple of the slow speed rate. In the exemplary embodiment, the high speed rate is 128 samples per cycle, which is four times the slow speed rate. This permits the slow speed data to be extracted from the high speed data, so that continuous data is available for the calculations performed during the slow speed sampling.

While the selected number of cycles in each repetition is two in the example, other numbers of cycles can be used. However, the number of cycles selected for each repetition sets the maximum number of cycles of high speed data that can be collected during a frame.

Sampling at the high speed rate for waveform capture can be implemented automatically in response to conditions in the ac electrical power distribution system 3, such as for instance, an overcurrent condition, a trip, a low voltage condition, or the like. In addition, high speed sampling can be commanded through the front panel 19 or remotely through the communications link 21. Also, high speed sampling can be initiated by a timer (not shown).

Figure 2:
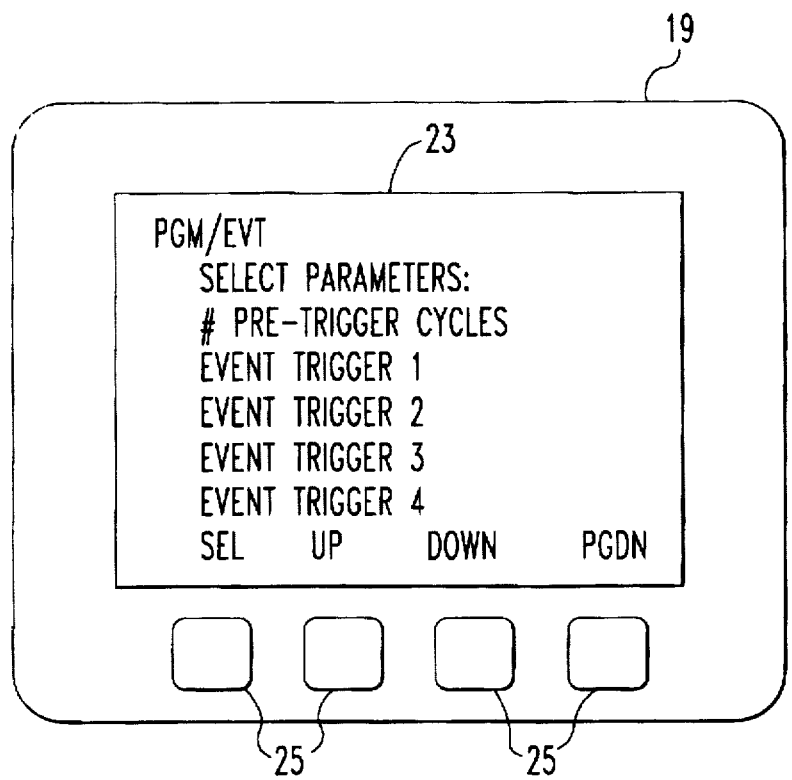
FIG. 2 is an elevation view of a display on a front panel which forms part of the monitor of FIG. 1.

Automatic high speed sampling is implemented by triggers, which are programmable. In the exemplary analyzer/monitor 1, there are seven programmable triggers. As shown in FIG. 2, the triggers are programmable through the front panel 19 which includes a display 23 and four push buttons 25, which function as soft switches in conjunction with associated switch functions that appear on the display. As shown, the left button 25 is a select button as indicated by the symbol SEL in the lower left hand corner of the display. Similarly, the second, third and fourth buttons 25 perform an UP, DOWN, PGDN (page down) function, respectively. The display 23 presents a series of menus. The UP and DOWN buttons permit the user to highlight an item on the menu and then select that item by pushing the SEL push button. The PGDN push button brings up additional pages of the menu. FIG. 3 is a diagram of the event trigger menu 27. As can be seen the menu has five active levels. When EVENT TRIGGERS is selected from a master menu (not shown), level 1 of the event trigger menu 27 is presented as shown in FIG. 2. First, the user can select the number of cycles that the event must be repeated in order to activate the trigger. In the exemplary system, this can be one to six cycles. The particular event trigger 1–7 is then selected using the push buttons 25 in the manner discussed above. The menu then enters level 2 where the user can select not to use the trigger or to select a criteria for the trigger such as: magnitude of the total harmonic distortion, percent total harmonic distortion, minimum, maximum, voltage disturbance, etc. as shown in FIGS. 3A–D. Upon selection of the criteria, the menu moves to level three, which as can be seen for magnitude total harmonic distortion allows the user to select the parameter for the event. Selection of the parameter then steps the menu to level 4, which allows the user to set a trigger threshold value, a reset threshold value, whether the reset is to be manual or automatic, and any delay time. For some of the events there is an additional fifth level of the menu, as for instance, in the case of a voltage disturbance.

Figure 4:
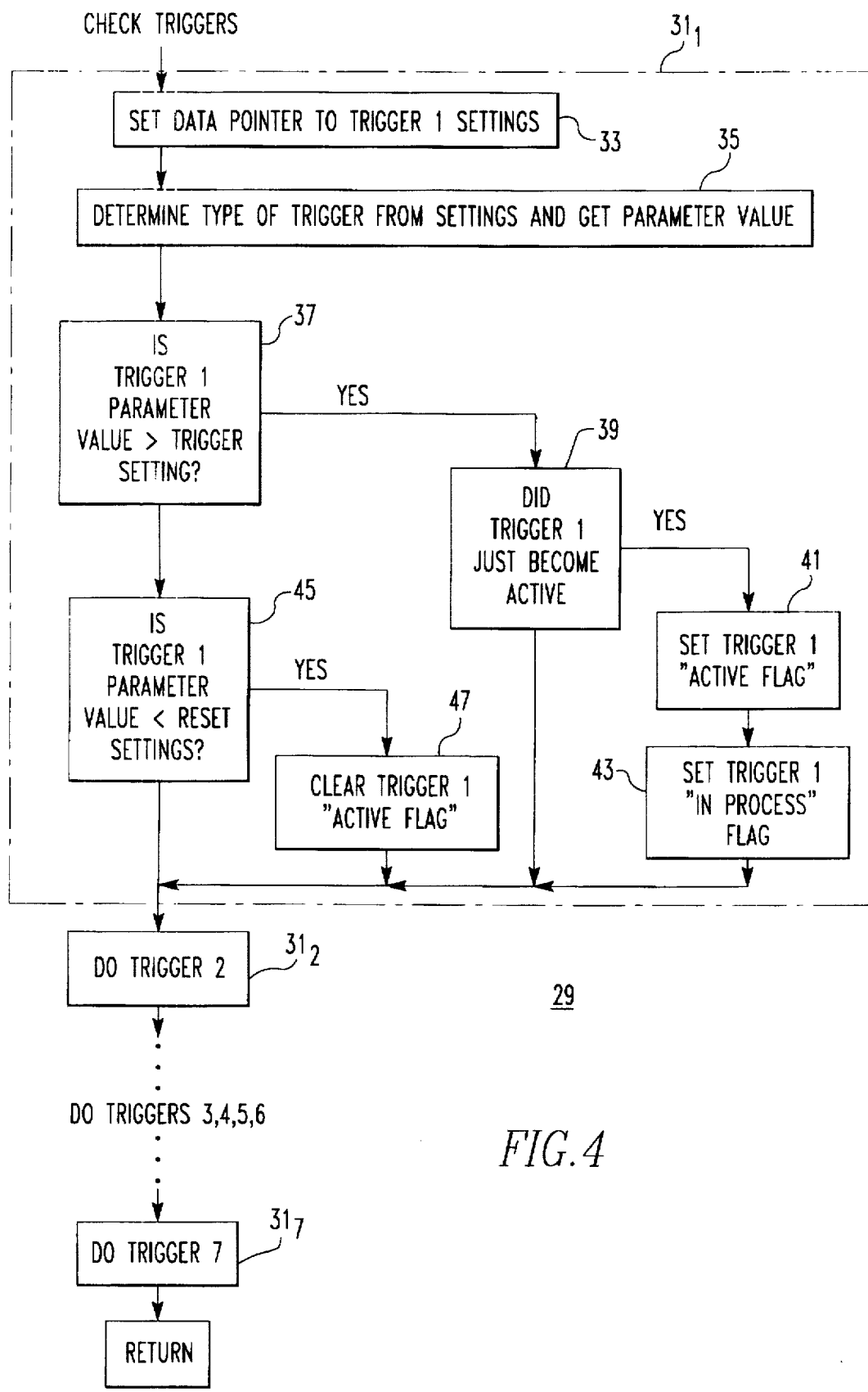
FIG. 4 is a flow chart of a check triggers software routine implemented by a digital processor which forms part of the monitor of FIG. 1.

The digital processor 15 runs routines that generate the interrupts for the digital sampling implemented by the A/D converter 13. In between sampling, the digital processor 15 runs other routines, including those that calculate the various electrical parameters, perform input/output functions, etc. One of these additional routines is the check triggers routine 29, which is shown in FIG. 4. When called, the check triggers routine 29 checks each of the seven triggers in sequence. As shown, trigger 1 is checked at $31_1$ by first setting the data pointer to the trigger 1 settings at 33. The type of trigger is then determined and the associated parameter value is obtained at 35. If the trigger 1 parameter value exceeds the trigger setting as determined at 37 and this is the first implementation of the routine in which this occurs as determined at 39, then a trigger 1 ACTIVE FLAG and IN PROCESS FLAG are set at 41 and 43, respectively. If the trigger 1 parameter does not exceed the trigger setting and in fact is below the reset setting as determined at 45, then the active flag for trigger 1 is cleared at 47. Similar functions are performed for triggers 2 through 7 at $31_2$ to $31_7$.

Figure 5:
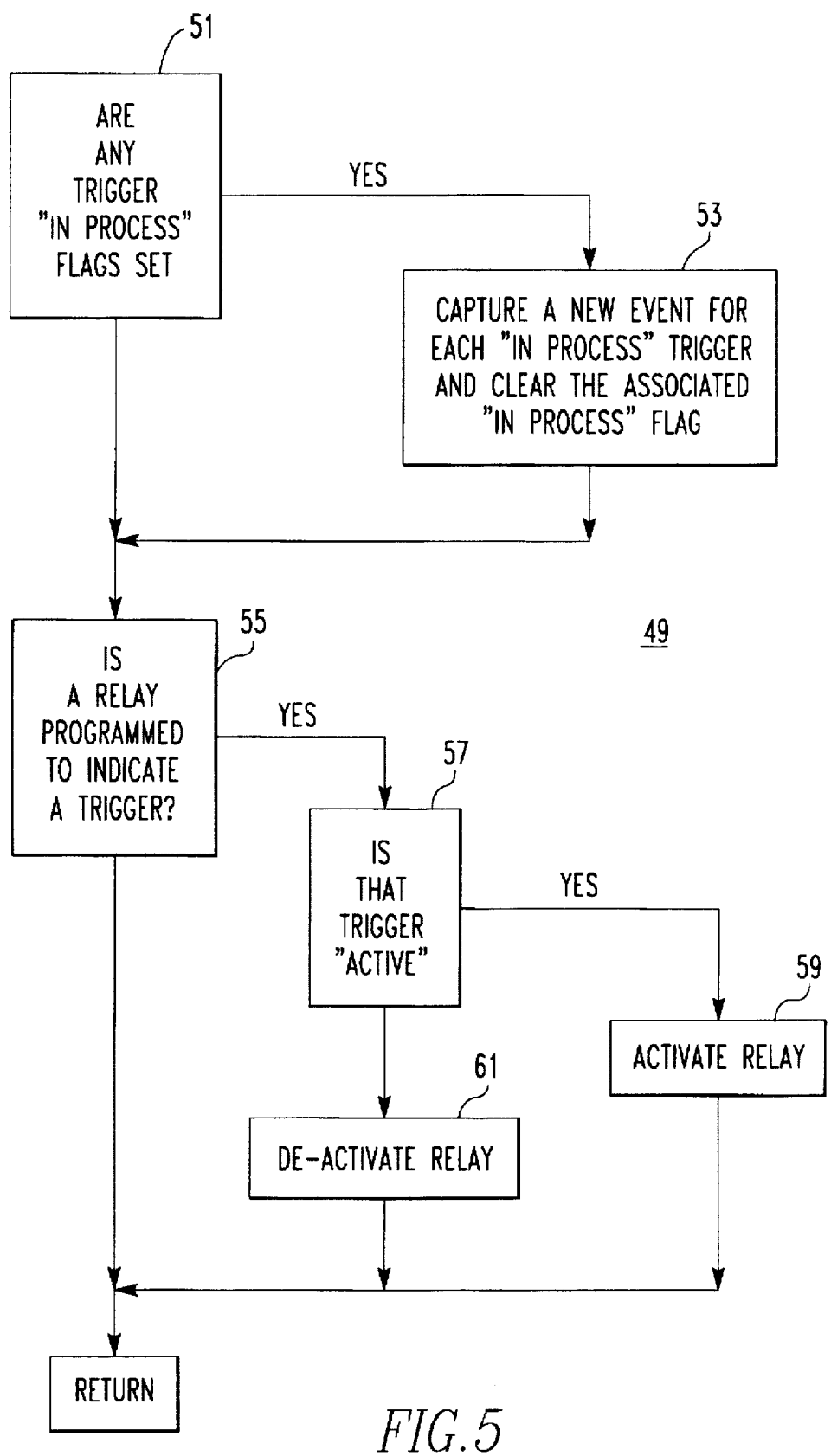
FIG. 5 is a flow chart of an events/relay routine implemented by the digital processor.

The digital processor also periodically runs an events/relay routine 33 at 49 as shown in FIG. 5. As shown there, the routine checks at 51 to see if any trigger IN PROCESS FLAGS are set. If so, high speed sampling is initiated at 53 to capture an event. Capturing an event comprises sampling at the high speed and storing the recorded samples. As mentioned, in the exemplary system this is implemented in the third repetition of the two cycle sequence in a sampling frame. Capture is performed sequentially in successive flames if more than one trigger is IN PROCESS. Thus, if all of the triggers are IN PROCESS, the selected portion of each of the waveforms is captured in seven successive sampling frames. One feature of the invention is that the same event can be programmed into multiple triggers. Thus, for instance, if a particular event is of interest, it can be programmed into all seven triggers, and high speed samples in seven successive sampling frames will be recorded. As each trigger initiates high speed sampling, the associated IN PROCESS flag is cleared at 53. If a relay is programmed to indicate a trigger at 55, and that trigger is active at 57, the relay is activated at 59. When the trigger is no longer active at 57, the relay is deactivated at 61.

Figure 6:
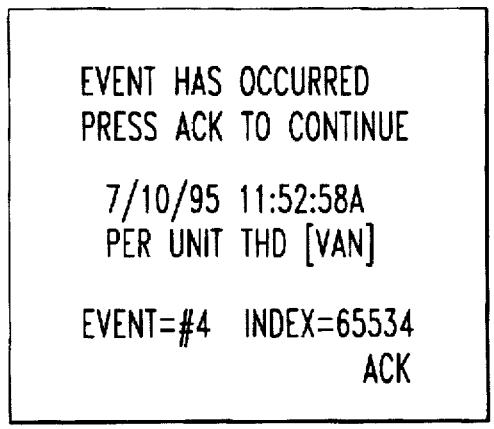
FIG. 6 is an alarm screen which is presented on the display of FIG. 2.
Figure 3A:
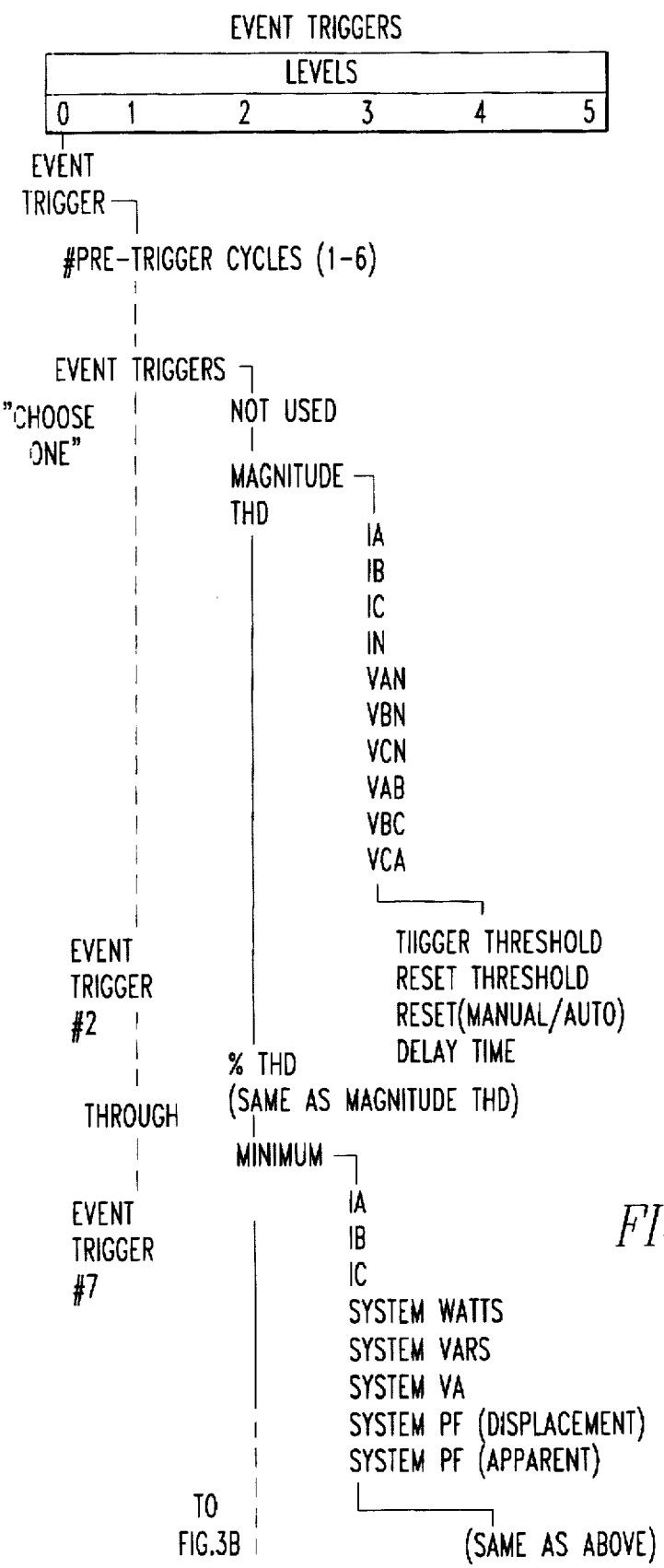
FIGS. 3A-D illustrate a multilevel event trigger menu which is presented on screens generated on the display of FIG. 2.
Figure 3B:
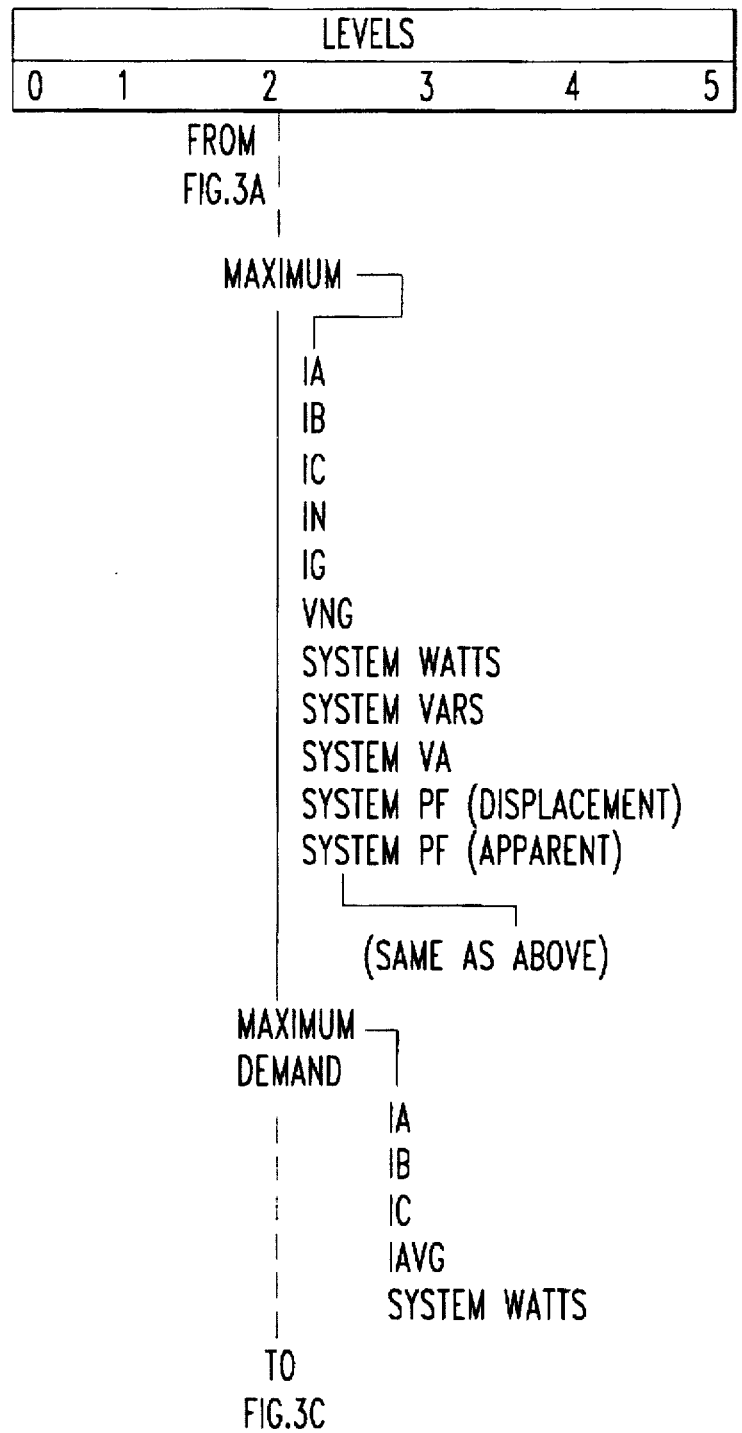
Figure 3C:
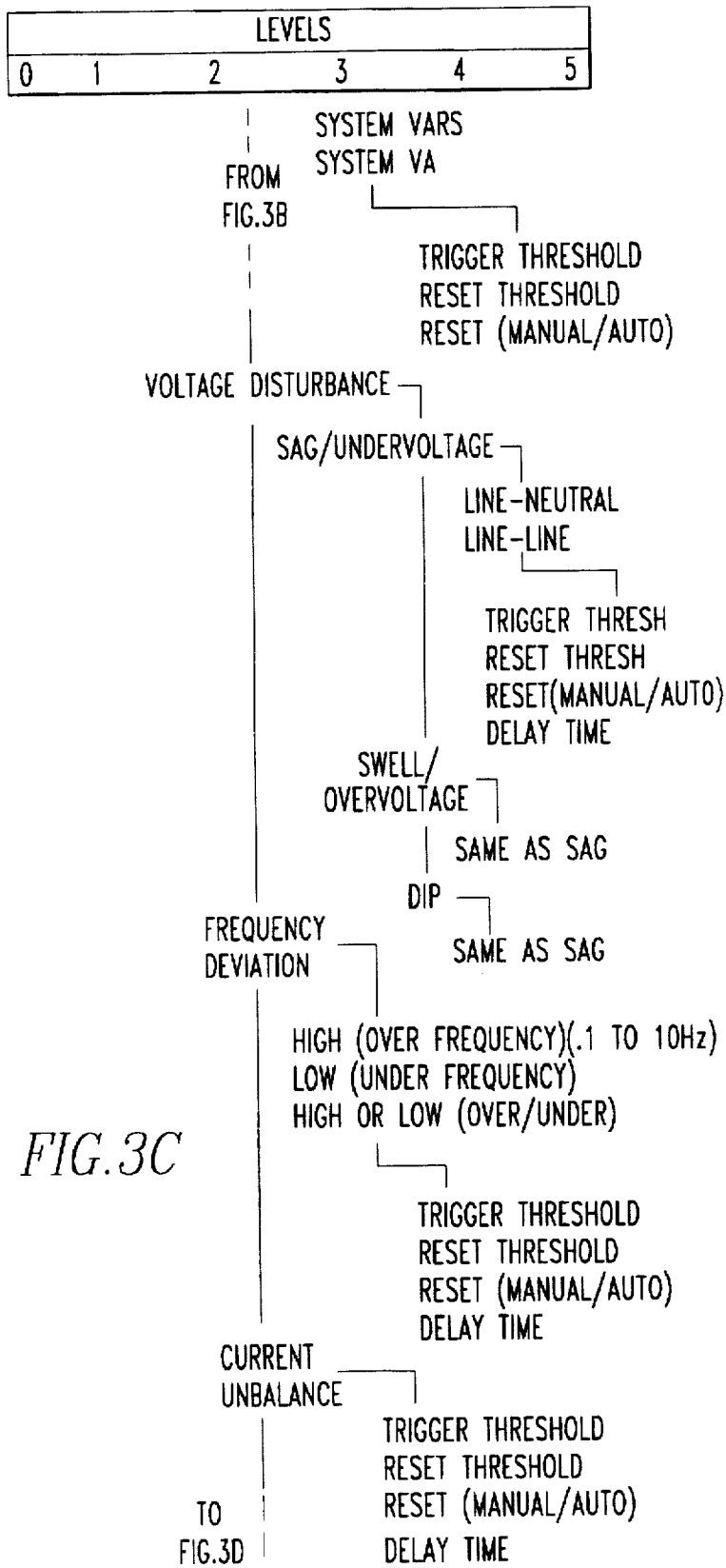
Figure 3D:
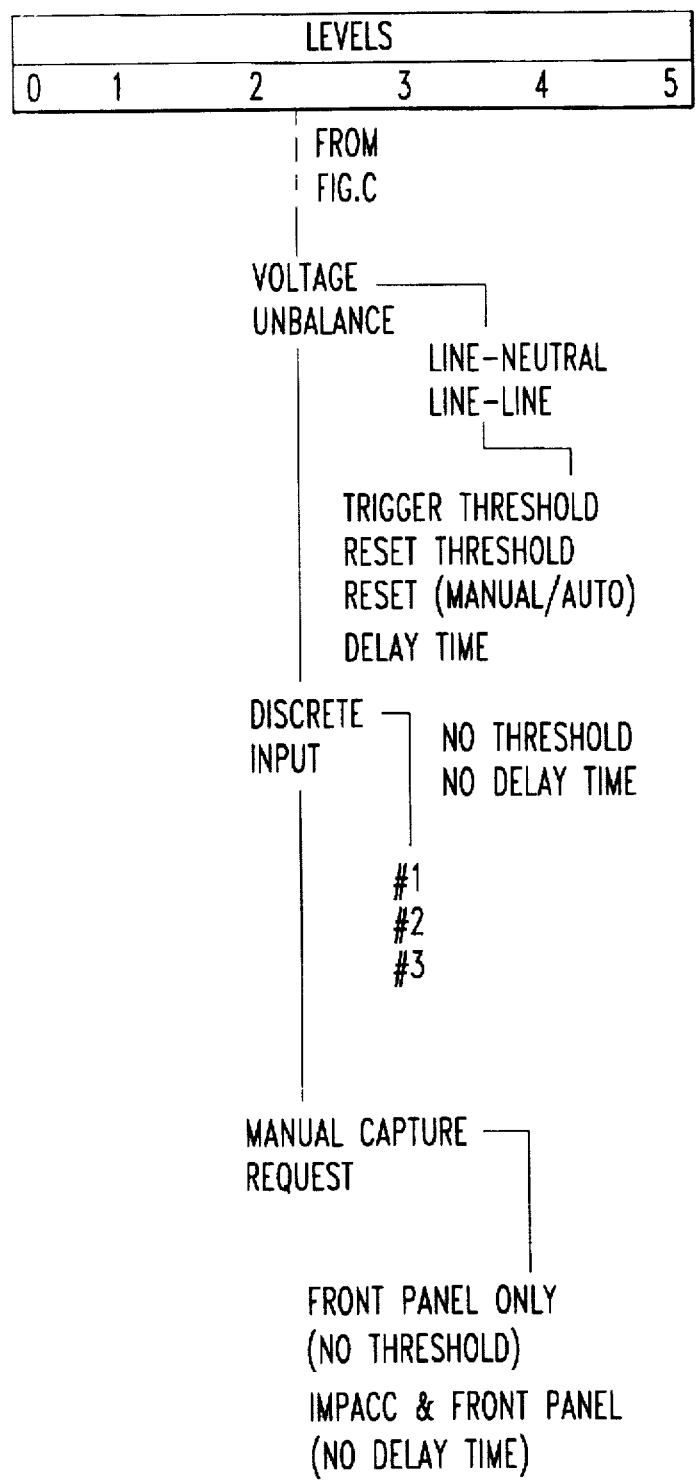

The monitor/analyzer 1 of the invention also generates alarm screens to notify the user that an event has occurred. An example of such alarm screen on the display 23 of the from panel 19 is shown in FIG. 6. The alarm screen 63 announces that the event has occurred, provides the date and time of the event and identifies the event. In the example, the event occurs when the per unit total harmonic distortion threshold on phase A to neutral voltage has been exceeded. The alarm screen further identifies the event/trigger number, and an index, which is a 16 bit identifying mark for waveforms that are uploaded into the computer. The screen also prompts the operator to press the acknowledge (ACK) soft key, which is the far right push button, in order to continue. If the condition persists, however, the alarm will reappear after a user-defined time out. In the example, this is one to fifteen minutes. In addition to the event alarms, there are three permanent alarms that are also displayed. These are alarms for hardware failure, excessive neutral-to-ground voltage and reverse sequence. These three alarms are recorded as flags, which put the monitor in the alarm mode. Again, the alarm is acknowledged by depressing the letters ACK, push button underneath the right side of the display.

Figure 7A:
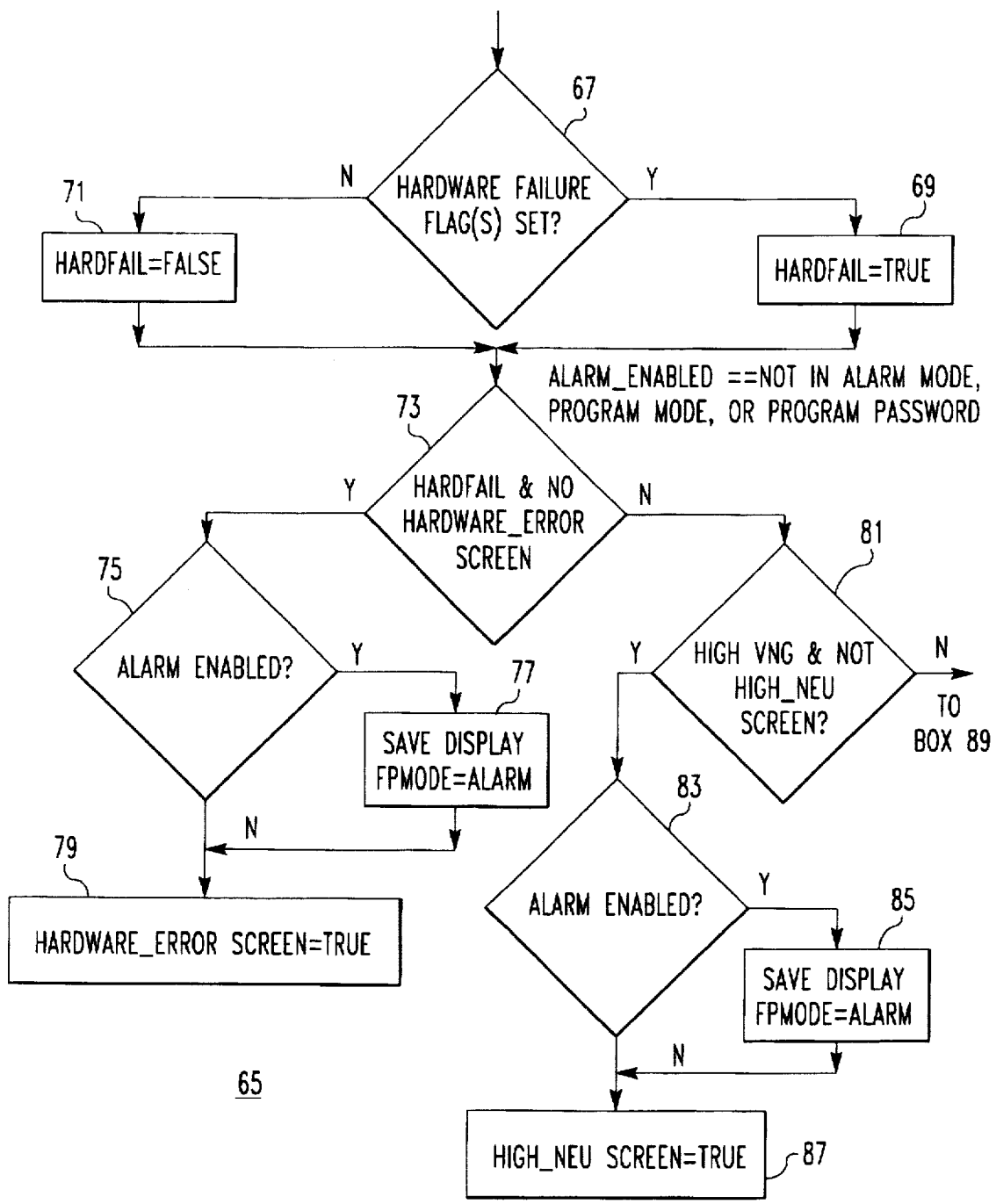
FIGS. 7A and B present a flow chart of a routine used by the monitor to generate the alarm screens
Figure 7B:
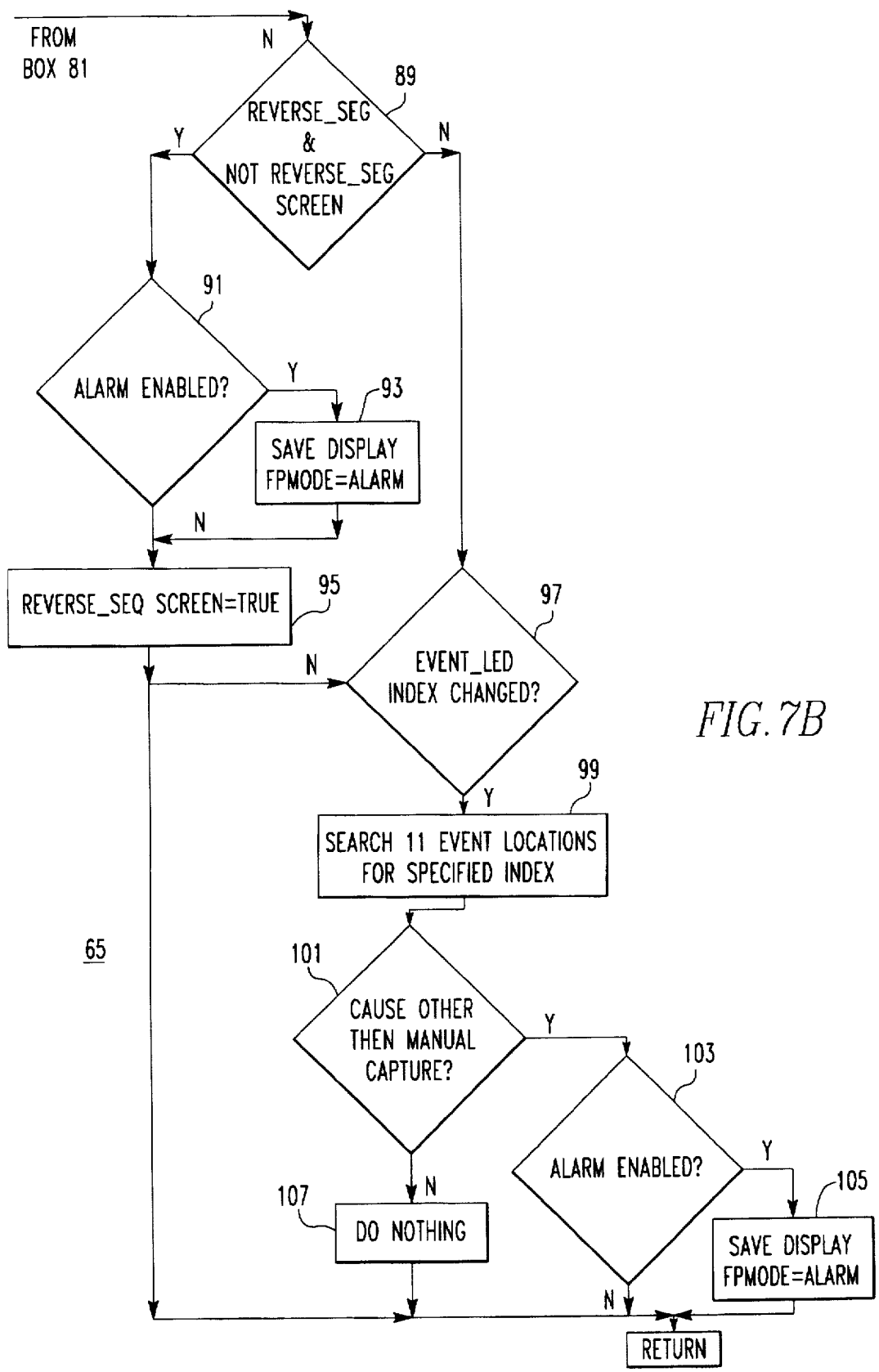

FIG. 7 illustrates a flow chart for the routine 65 used by the digital processor 15 to generate the three permanent alarm screens. As shown in FIG. 7, if a flag is set at 67 indicating a hardware failure, a HARDFAIL flag is made TRUE 69; otherwise, it is made FALSE at 71. If the HARDFAIL flag is TRUE but a HARDWARE ERROR screen has not been set as determined at 73, a check is made at 75 as to whether the alarm is enabled. The alarm is enabled if the processor is not in the ALARM mode or PROGRAM mode. If this is true, the display is saved at 77, and the system set in the ALARM mode with the HARDWARE ERROR screen displayed at 79.

If at 73 the HARDFAIL flag is false or the HARDWARE ERROR screen is set true at 73, then a determination is made at 81 as to whether the neutral to ground voltage is high. If so, and the HIGH NEUTRAL voltage screen is not set and the alarm is enabled at 83, then the display is saved and the system is placed in the ALARM mode 85 before the HIGH NEUTRAL ALARM screen flag is set TRUE at 87 to generate a high neutral-to-ground voltage screen on the display. If there is no hardware failure and the neutral-to-ground voltage is not high, a check is made at 89 as to whether a REVERSE SEQUENCE flag is set and the REVERSE SEQUENCE screen is not TRUE. If this is so, and the alarm is enabled at 91 then the display is saved and the system is transferred to the ALARM mode at 93 before the REVERSE SEQUENCE screen is made TRUE at 95 to generate the REVERSE SEQUENCE ALARM screen on the display. If none of the three permanent alarms have been generated, the event LED index is checked at 97 to see if it has changed indicating there has been a new event. There are eleven locations for storing the most recent events. If the index has changed, those locations are checked at 99 for the specified index. If the cause of the event was other than a manual capture as determined at 101 and the alarm is in the enabled state at 103 then the current display is saved and the system is placed in the ALARM mode at 105. If a manual capture was ordered, nothing is done as indicated at 107 since this is not an alarm condition.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention, which is to be given the full breadth of the claims appended and any and all equivalents thereof.

What is claimed is:

1. Apparatus for monitoring an electric power system, comprising:

means for sensing multiple waveforms in said electric power system;

sampling means for generating digital samples of each of said multiple waveforms sensed by said sensing means;

display means; and digital processing means comprising processing means for generating from said digital samples of each of said waveforms values of a plurality of electrical parameters, programmable trigger means generating programmable trigger signals when said values of programmable ones of said electrical parameters exceed selected thresholds, and capture means capturing said digital samples for a selected portion of at least one of said waveforms in response to each of said trigger signals.

2. The apparatus of claim 1 wherein said selected portion of at least one of said waveforms is a selected portion of each of said waveforms; and wherein said capture means captures said digital samples for said selected portion of each of said waveforms in response to said programmable trigger signals.

3. The apparatus of claim 2 wherein said programmable trigger means comprises means programmable through said display means for sequentially generating said trigger signals and wherein said capture means captures said digital samples for successive ones of said selected portion of each of said waveforms in response to said sequentially generated trigger signals.

4. The apparatus of claim 3 wherein said sampling means comprises means generating said digital samples at a first sampling rate and at a second, faster sampling rate, and wherein said digital processing means comprises means using said digital samples generated at said first rate for generating said values of said plurality of said electrical parameters, and said capture means using said samples generated at said second rate in response to one of the programmable trigger signals.

5. The apparatus of claim 2 wherein said capture means captures said digital samples for said selected portion of each of said waveforms simultaneously in response to one of said programmable trigger signals.

6. The apparatus of claim 1 wherein said programmable trigger means comprises means programmable through said display means for sequentially generating said trigger signals and said capture means captures said digital samples for successive ones of said selected portion of said at least one of said waveforms in response to said sequentially generated trigger signals.

7. The apparatus of claim 1 wherein said sampling means comprises means generating said digital samples at a first sampling rate and a second, faster sampling rate, and wherein said digital processing means comprises means using said digital samples generated at said first sampling rate for generating said values of said plurality of electrical parameters, and said capture means uses said samples gen-erated at said second rate in response to one of the programmable trigger signals.

8. The apparatus of claim 1 wherein said digital processing means includes alarm means generating alarms in response to predetermined values of said electrical parameters which exceed said selected thresholds, and wherein said display means includes means generating an alarm display in response to an alarm.

9. The apparatus of claim 8 wherein said alarm means comprises means generating an alarm screen on said display in response to an alarm.

10. The apparatus of claim 8 wherein said sensing means includes means sensing neutral current in said electrical system and wherein said alarm means generates an alarm when said neutral current exceeds a predetermined value.

11. The apparatus of claim 10 wherein said alarm means generates an alarm when total harmonic distortion of neutral current exceeds a predetermined value.

12. The apparatus of claim 1 wherein said programmable trigger means includes means programming a same value of said values of programmable ones of said electrical parameters in order that when said selected thresholds are exceeded, said capture means captures multiple repetitions of said selected portion of said at least one of said waveforms.

13. The apparatus of claim 1 wherein said programmable trigger means includes means selecting any one of said electrical parameters for association with any one of said programmable trigger signals.

* * * * *